(12) United States Patent
Cai et al.

(10) Patent No.: US 11,588,331 B2
(45) Date of Patent: Feb. 21, 2023

(54) METHOD AND SYSTEM FOR TRANSFERRING A LOAD IN A THUNDER AND LIGHTNING WEATHER

(71) Applicants: STATE GRID JIANGSU ELECTRIC POWER CO., LTD., Nanjing (CN); STATE GRID SUZHOU POWER SUPPLY COMPANY, Suzhou (CN); STATE GRID JIANGSU ELECTRIC POWER CO., LTD. MARKETING CENTER, Nanjing (CN)

(72) Inventors: Yunfeng Cai, Suzhou (CN); Chong Tong, Suzhou (CN); Ning Wang, Suzhou (CN); Yang Xu, Suzhou (CN); Huiwen Lu, Suzhou (CN); Kang Dai, Suzhou (CN); Wei Yin, Suzhou (CN); Bowen Wu, Suzhou (CN); Liang Wang, Suzhou (CN); Jianqiang Miao, Suzhou (CN)

(73) Assignees: STATE GRID JIANGSU ELECTRIC POWER CO., LTD., Nanjing (CN); STATE GRID SUZHOU POWER SUPPLY COMPANY, Suzhou (CN); STATE GRID JIANGSU ELECTRIC POWER CO., LTD. MARKETING CENTER, Nanjing (CN)

( * ) Notice: Subject to any disclaimer, the term of this patent is extended or adjusted under 35 U.S.C. 154(b) by 327 days.

(21) Appl. No.: 16/987,864

(22) Filed: Aug. 7, 2020

(65) Prior Publication Data

US 2021/0066914 A1 Mar. 4, 2021

(30) Foreign Application Priority Data

Aug. 9, 2019 (CN) .......................... 201910732890.8
Aug. 9, 2019 (CN) .......................... 201910732908.4

(51) Int. Cl.
*H02J 3/06* (2006.01)
*G06Q 10/04* (2023.01)
(Continued)

(52) U.S. Cl.
CPC ............ *H02J 3/06* (2013.01); *G01R 29/0842* (2013.01); *G01W 1/10* (2013.01); *G01W 1/16* (2013.01); *G06Q 10/04* (2013.01); *H02H 3/22* (2013.01)

(58) Field of Classification Search
CPC ........ H02J 3/06; G01R 29/0842; G01W 1/10; G01W 1/16; G06Q 10/04; H02H 3/22
See application file for complete search history.

(56) References Cited

U.S. PATENT DOCUMENTS

2020/0059093 A1\* 2/2020 Tong ................... H02J 13/0004

FOREIGN PATENT DOCUMENTS

| CN | 106410792 A | 2/2017 |
|---|---|---|
| CN | 107453352 A | 12/2017 |
| CN | 106410792 B | 3/2019 |

\* cited by examiner

*Primary Examiner* — Curtis B Odom
(74) *Attorney, Agent, or Firm* — ArentFox Schiff LLP

(57) ABSTRACT

Provided are a load transfer method and system in thunder and lightning weather. The method includes: detecting lightning and predicting a position and time of a lightning strike to obtain a lightning prediction result; determining a transmission line possibly struck by lightning in a power grid according to the lightning prediction result; determining a load transfer scheme; and before the lightning occurs, transferring at least part of loads on the transmission line possibly struck by lightning according to the load transfer scheme.

17 Claims, 5 Drawing Sheets

(51) Int. Cl.
*G01W 1/10* (2006.01)
*G01W 1/16* (2006.01)
*G01R 29/08* (2006.01)
*H02H 3/22* (2006.01)

METHOD AND SYSTEM FOR TRANSFERRING A LOAD IN A THUNDER AND LIGHTNING WEATHER

CROSS-REFERENCE TO RELATED APPLICATION

This application claims priority to Chinese Patent Application No. 201910732908.4 filed Aug. 9, 2019 and Chinese Patent Application No. 201910732890.8 filed Aug. 9, 2019, the disclosures of which are incorporated herein by reference in their entirety.

TECHNICAL FIELD

This application relates to the field of lightning protection and load control, for example, to a load transfer method and system in thunder and lightning weather.

BACKGROUND

Lightning has always been an important natural factor endangering the operation safety of a power grid. As the scale of the power grid keeps increasing, the impact of lightning on the power grid is becoming more significant. For a load center area in an area where lightning often occurs, due to the extremely high load density of the power grid, one lightning storm may cause hundreds of power supply lines of the power grid to trip out, resulting in a large number of customers losing power and bringing huge economic losses. Therefore, lightning protection of the power grid is particularly important.

At present, a main lightning protection strategy adopted by the power system is to divert lightning energy through the multiple types of lightning protection devices installed on equipment and transmission lines, so as to reduce the probability that the equipment in the power grid trips out due to a lightning strike, thereby achieving static lightning protection. For example, lightning rods are installed in and around substations to reduce the possibility that the lightning strikes equipment in the substations; lightning conductors are disposed above transmission lines to protect the lines below them; grounding devices of transmission towers are optimized to reduce the grounding resistance of the towers and weaken the ground potential rise caused by a lightning strike on the towers; line insulation is strengthened so that it can bear the overvoltage caused by a lightning strike.

From the perspective of operation effects, static lightning protection equipment can provide better protection for the equipment in the substations, but the lightning protection effect for transmission lines is not good. Due to the randomness of discharge channels of the lightning, the situation where the lightning bypasses the lightning conductors and strikes the phase line under the lightning conductors occurs occasionally. More common than the bypass strike is the arcing between the transmission tower and lines caused by the transmission tower being struck by the lightning. Due to the diversity and complexity of the geology and climatic conditions in transmission corridors, the effect of reducing the grounding resistance and strengthening the line insulation is not significant.

Additionally, after a lightning strike accident occurs, there is still no effective method to deal with the affected loads. Although lines are usually equipped with automatic reclosing equipment and standby power switch devices, on the one hand, line tripping out caused by lightning is largely caused by line insulation arcing, which is not instantaneous, so reclosing generally cannot succeed; on the other hand, at present, the substation is usually not equipped with a dedicated standby power supply, but two transformers in operating are used and the two transformers are standby for each other. Since lightning usually occurs during an on-peak period of loads in summer, a main transformer and a standby transformer are in high load rate states respectively. If all loads of one transformer are transferred to the other transformer due to the power-loss of the one transformer, it will cause serious overload, which may lead to expansion of the accident. Therefore, in practice, when the line trips out due to the lightning strike, the standby power supply is rarely put into use.

At present, the power grid adopts a rigid processing approach to the processing of the lightning protection and the loads, that is, if the normal operation of equipment and loads cannot be ensured, all of them will be cut off.

It is thus seen that the passive lightning protection measures for the power system mainly have the following limitations: the cost of the equipment is relatively high, and it will increase with the growth of the scale of power grid equipment; for transmission lines, the success rate of lightning protection is low; early warning is so lacking that almost no time is reserved for handling faults; after the trip-out, the load is cut off directly, causing large-area power outage and economic losses; a large amount of loads are disconnected from the grid in a short time, causing a great impact on the system.

SUMMARY

This application provides a load transfer method and system in thunder and lightning weather that can reasonably and effectively control a power grid, thereby reducing the impact of lightning on the power grid, increasing success rate of lightning protection and utilization rate of the power grid.

This application provides a load transfer method in thunder and lightning weather. The method includes the following steps: lightning is detected and a position and time of a lightning strike are predicted to obtain a lightning prediction result; a transmission line possibly struck by lightning in a power grid is determined according to the lightning prediction result; a load transfer scheme is determined; and before the lightning occurs, at least part of loads on the transmission line possibly struck by the lightning is transferred according to the load transfer scheme.

This application further provides a load transfer system in thunder and lightning weather for implementing the preceding method. The system includes a lightning detection module, a lightning prediction module, a control and decision system and an executive system.

The lightning detection module is configured to detect lightning.

The lightning prediction module is connected to the lightning detection module and configured to predict a position and time of a lightning strike to obtain a lightning prediction result.

The control and decision system is connected to the lightning prediction module and configured to determine a transmission line possibly struck by lightning in a power grid according to the lightning prediction result and determine a load transfer scheme.

The executive system is connected to the control and decision system and configured to, before the lightning occurs, execute the load transfer scheme to transfer at least part of loads on the transmission line possibly struck by the lightning.

DETAILED DESCRIPTION

This application is further described below in conjunction with the drawings and embodiments.

An embodiment of this application provides a load transfer method in thunder and lightning weather. The method includes the following steps: lightning is detected and a position and time of a lightning strike are predicted to obtain a lightning prediction result; a transmission line possibly struck by lightning in a power grid is determined according to the lightning prediction result; a load transfer scheme is determined; and before the lightning occurs, at least part of loads on the transmission line possibly struck by the lightning is transferred according to the load transfer scheme.

Figure 1:
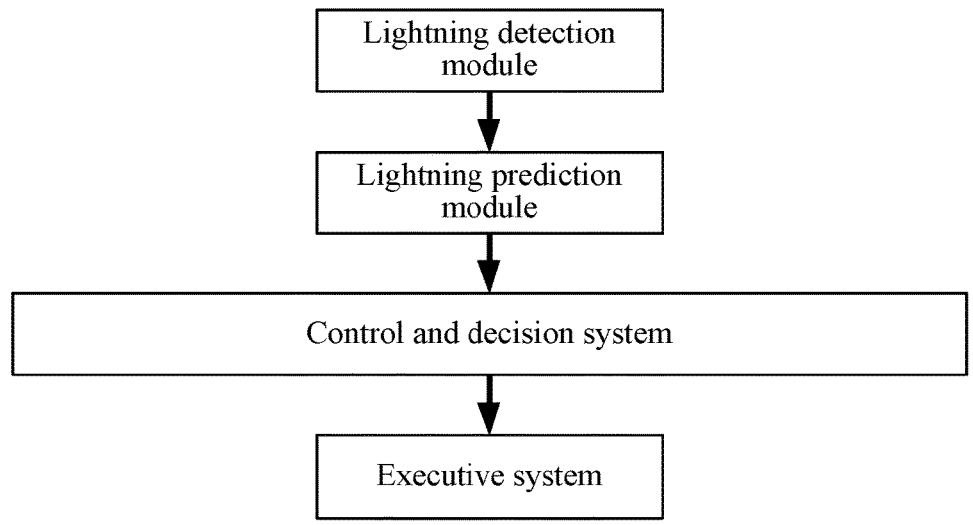
FIG. 1 is a schematic diagram of a load transfer system in thunder and lightning weather according to an embodiment of this application.

An embodiment of this application provides a load transfer system in thunder and lightning weather. As shown in FIG. 1, the system includes a lightning detection module, a lightning prediction module, a control and decision system and an executive system.

The lightning detection module is configured to detect lightning. The lightning prediction module is connected to the lightning detection module and configured to predict a position and time of a lightning strike to obtain a lightning prediction result. The control and decision system is connected to the lightning prediction module and configured to determine a transmission line possibly struck by lightning in a power grid according to the lightning prediction result and determine a load transfer scheme. The executive system is connected to the control and decision system and configured to, before the lightning occurs, execute the load transfer scheme to transfer at least part of loads on the transmission line possibly struck by the lightning.

This application further provides embodiment one and embodiment two described below, and the load transfer method and system in the preceding embodiments are described in further detail in embodiment one and embodiment two.

Embodiment One

This embodiment provides a load transfer method in thunder and lightning weather. The method includes a preparation stage and an implementation stage as below.

1. Preparation Stage

Multiple loads in a power grid (a power system in a region) are pre-classified according to significance of them, so as to obtain a classification result. Usually, the loads are classified into primary loads, important loads and general loads in descending order of the significance.

The primary loads mainly include two types, one is a load that has a significant impact on production and operation activities and will cause significant economic losses in the case of power outage, such as blast furnaces in steel mills and spinning machines in textile mills, and the other is a load that has a significant impact on social operations, such as operating rooms in hospitals, urban subway lines and high-speed rail lines. The important loads mainly refer to a load that undertakes relatively large production tasks and can create relatively great economic values, but not causes additional losses in the case of power outage, such as machine tools that can be interrupted. The general loads refer to a load that is dominated by life power supplies and has a small impact after interruption, such as air conditioners, electric water heaters and lighting sources.

The preceding scheme is an overall load classification scheme. In actual operation, it is necessary to classify the loads according to customers' will and different operating conditions in the power grid. For example, the significance of lighting sources applied in different times and places are apparently different. For some important loads, relevant agreements may be signed with customers, and in special cases such as lightning, such important loads are regarded as general load to be processed and certain compensations are provided.

After the load classification is completed, the customers are classified according to load sorts owned by the customers in the power grid. Almost all customers in the power grid have general loads so the customers in the power grid are classified into four sorts according to the combinations of primary loads and important loads owned by the customers, that is, according to the load sorts owned by the customers in the power grid. The four sorts of the customers are a sort-I customer, a sort-II customer, a sort-III customer and a sort-IV customer. The sort-I customer is a grid customer who owns at least both primary loads and important loads. The sort-II customer is a grid customer who owns at least primary loads but does not own important loads. The sort-III customer is a grid customer who owns at least important loads but does not own primary loads. The sort-IV customer is a grid customer who owns only general loads.

2. Implementation Stage

This stage includes the steps described below.

In step 1, lightning is detected and a position and time of a lightning strike are predicted to obtain a lightning prediction result.

In step 2, a transmission line in the power grid possibly struck by lightning is determined according to the lightning prediction result.

In step 3, a load transfer scheme is determined, and before the lightning occurs, at least part of loads on the transmission line possibly struck by the lightning is transferred to a standby transmission line and/or a distributed micro-grid and/or a power storage device.

In this step, the operation mode of the power grid is adjusted according to the lightning strike prediction result, and the load transfer scheme is determined according to the load classification result. In an embodiment, the load transfer scheme may include the following: primary loads owned by the sort-I customer and the sort-II customer are transferred to the standby transmission line, important loads and/or general loads owned by the sort-I customer and the sort-II customer are transferred to the distributed micro-grid and/or the power storage device, and loads owned by the sort-III customer and the sort-IV customer are kept unchanged. During determining the load transfer scheme, a part of primary loads owned by the sort-I customer and the sort-II customer is transferred to the distributed micro-grid and/or the power storage device if the remaining capacity of the standby transmission line is not enough to carry the primary loads owned by the sort-I customer and the sort-II customer.

Figure 2:
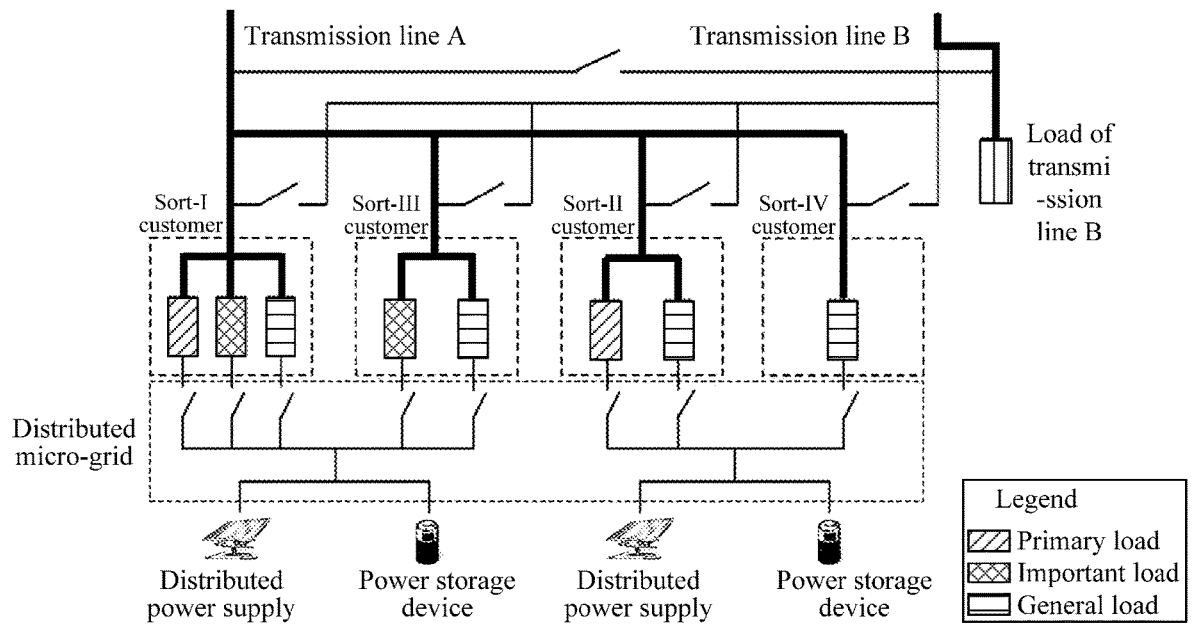
FIG. 2 is a schematic diagram of a normally operating power grid according to embodiment one of this application.

For example, in the power grid as shown in FIG. 2, transmission line A and transmission line B are two transmission lines which are standby for each other, and each of the transmission line A and the transmission line B carries certain loads and there are various sorts of customers on each of the transmission line A and the transmission line B. In addition, there are a number of distributed power supplies and power storage devices in the region. These distributed power supplies and power storage devices are connected to the customers through a distributed micro-grid and are in a standby state under normal conditions, as shown in FIG. 2.

Figure 3:
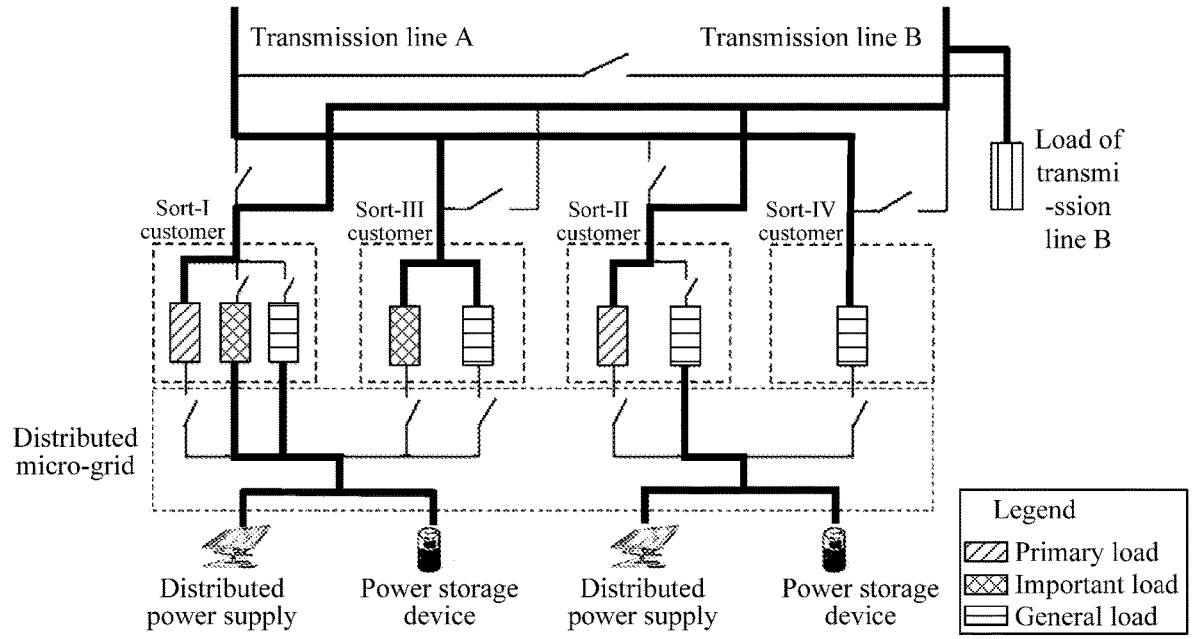
FIG. 3 is a schematic diagram of load transferring before lightning occurs in a load transfer method in thunder and lightning weather according to embodiment one of this application.

When it is prompted that the transmission line A is likely to be struck by lightning within a certain period of time, the operation mode of the power grid is adjusted according to the amount of the loads in the line regional power grid, the load rate on the transmission line B and the output levels of the distributed power supplies and the power storage devices. Ideally, all the primary loads owned by the sort-I customer and the sort-II customer carried by the transmission line A should be transferred to the transmission line B, then the important loads and general loads of these customers are transferred to be powered by the distributed micro-grid, so that the burden of the transmission line B is eased, and the loads of the sort-III customer and sort-IV customer carried by the transmission line A are kept unchanged, as shown in FIG. 3.

Figure 4:
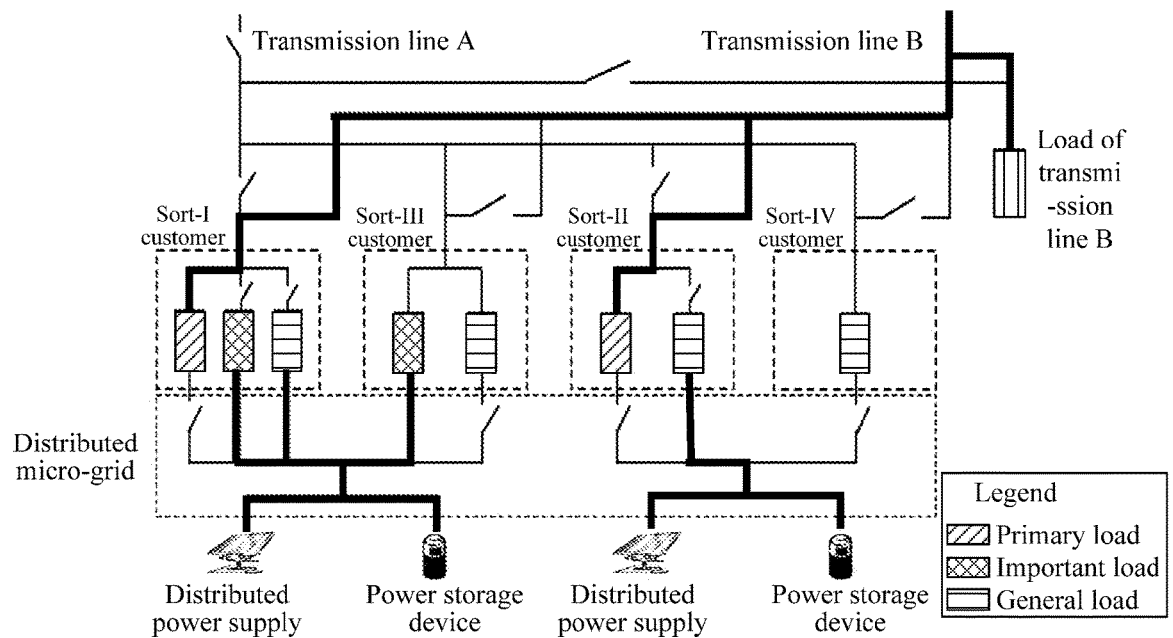
FIG. 4 is a schematic diagram of load transferring after lightning occurs according to embodiment one of this application.
Figure 5:
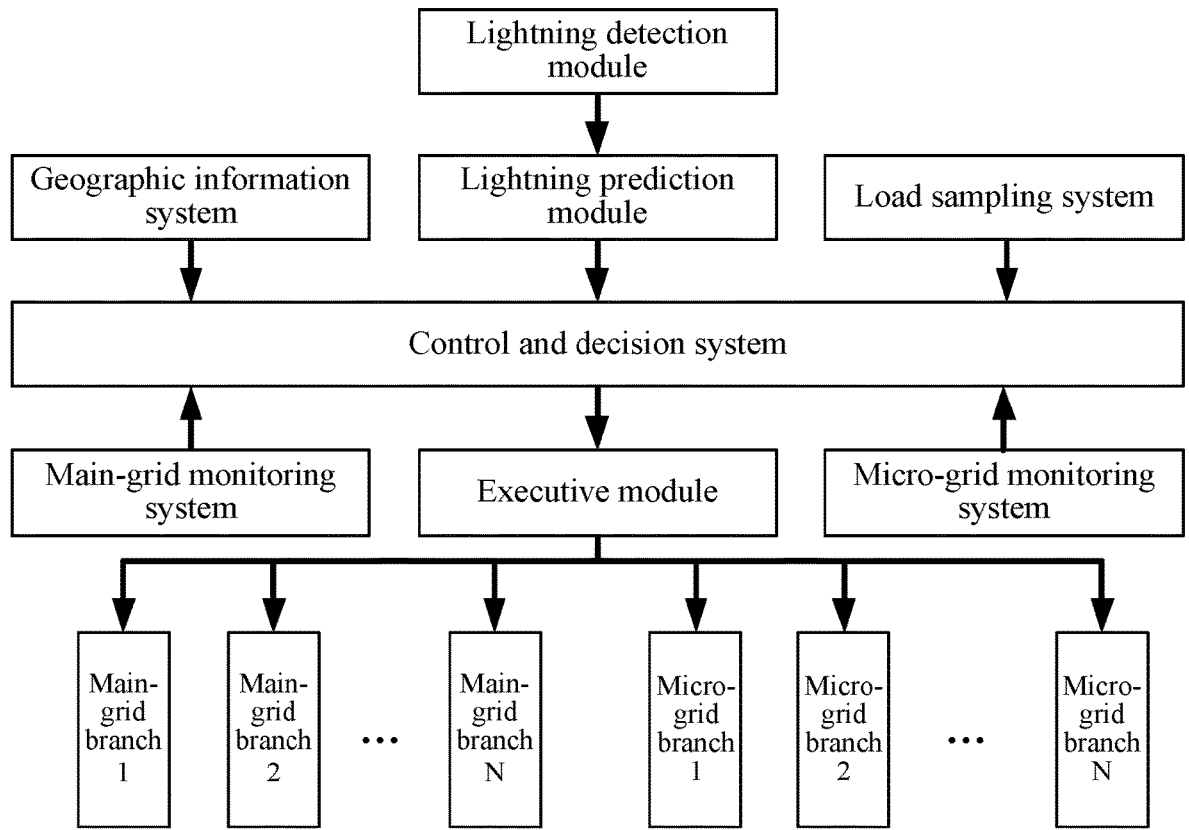
FIG. 5 is a schematic diagram of a load transfer system in thunder and lightning weather according to embodiment one of this application.

In step 4, after a period of time, the transmission line A trips out after struck by the lightning. At this time, the loads of the sort-I customer and the sort-II customer carried by the transmission line A have all been transferred and are not affected by the trip-out, and the remaining part of loads, that is, the loads of the sort-III customer and the sort-IV customer, are quickly transferred to the distributed micro-grid and/or power storage devices by the automatic apparatus after the trip-out. The transfer amount depends on the carrying capability of the micro-grid, and the power supplying of important loads is guaranteed in priority, as shown in FIG. 4.

In step 5, after the lightning occurs, the transferred loads are recovered to the normal state before the transferring if the transmission line, such as the transmission line A, possibly struck by the lightning operates normally. If the fault of the transmission line A cannot be recovered in a short time, the subsequent processing is performed on the transferred loads according to the carrying capability of the transmission line B and the distributed power supplies until the transmission line A is recovered to operate.

The preceding load transfer method in thunder and lightning weather is implemented by a load transfer system in thunder and lightning weather. As shown in FIG. 3, the load transfer system in thunder and lightning weather mainly includes a lightning detection module, a lightning prediction module, a control and decision system and an executive module. In an embodiment, the system may further include a geographic information system, a main-grid monitoring system and a micro-grid monitoring system.

The lightning detection module is configured to detect lightning. The lightning prediction module is connected to the lightning detection module and configured to predict a position and time of a lightning strike to obtain a lightning prediction result. In this embodiment, the lightning detection module and the lightning prediction module use lightning sensors installed on the ground to measure the variation in electric field intensity in the air and the electromagnetic radiation generated by lightning activities and predict the position and the approximate time of the lightning strike by performing a time-domain quantitative analysis on the lightning activities on the basis of the broad-spectrum frequency-division sensing technology and in combination with the time-domain differential technology. This technology has been covered in a previously applied patent (application number CN201710615287.2) and thus is not detailed here.

The control and decision system is connected to the lightning prediction module and configured to determine a transmission line possibly struck by lightning in a power grid according to a lightning prediction result, determine a load transfer scheme, and send out a corresponding control signal.

The executive module is connected to the control and decision system and the power grid and the executive module is configured to execute the load transfer scheme according to the control signal, and before the lightning occurs, transfer at least part of loads on the transmission line possibly struck by the lightning to a standby transmission line and/or a distributed micro-grid and/or a power storage device.

The geographic information system is connected to the control and decision system and configured to provide the control and decision system with geographic information required in determining the transmission line possibly struck by the lightning in the power grid.

The main-grid monitoring system is connected to the control and decision system and configured to provide the control and decision system with operation status data of the power grid.

The micro-grid monitoring system is connected to the control and decision system and configured to provide the control and decision system with operation status data of the distributed micro-grid.

According to the load transfer method in thunder and lightning weather provided in this embodiment of this application, reasonable load transfer can be performed on the power grid in advance for the lightning, thereby reducing the load losses that may be caused by the lightning and improving the stability of the operation of the power grid. Moreover, the implementation cost is low.

In this embodiment, flexible switching of loads and dynamic lightning protection of the power grid are achieved based on lightning early warning and comprehensive control on the source, load and storage of the grid. The advantages are described below.

(1) Sufficient processing time: due to long advance warning of the lightning strike, there can be a long time for load transfer and power grid adjustments when responding to lightning strike faults, thereby minimizing the damage of trip-out caused by the lightning strike.

(2) High prediction accuracy rate: according to actual operation experience, the lightning early warning system in this embodiment has an accuracy rate of over 99% in predicting lightning strikes within a core region covering 200 square kilometers.

(3) Small load loss: through precise clustering of loads, primary loads are transferred to an adjacent standby line before the lightning strike occurs, and the output of distributed power supplies and power storage devices in the regional micro-grid is fully utilized to supply the remaining part of loads. Therefore, when the line trips out due to the lightning strike, since the line carries only part of important loads, the caused load loss is greatly reduced.

(4) High stability of the power grid: since the trip-out caused by the lightning strike is predicted and processed in advance, the number of loads carried by the faulty line is less, the trip-out has little impact on the regional power grid, and the probability of a power grid chain reaction caused by the trip-out is greatly reduced.

(5) Low implementation cost: at present, a large number of various power storage devices and distributed power supplies have been arranged in the power grid, but the overall utilization rate is not high. According to this embodiment, the functions of these devices can be fully utilized without the need for too much additional investment. As for lightning prediction, since the accurate detection range of the sensor is large and does not vary significantly with the increase of the number of the devices, the investment cost of this embodiment is significantly lower than that of the traditional static lightning protection methods.

Embodiment Two

This embodiment provides a load transfer method in thunder and lightning weather. The method includes the steps described below.

In step 1, lightning is detected and a position and time of a lightning strike are predicted to obtain a lightning prediction result.

In this step, lightning detection is implemented by a lightning detection module. The position and time of the lightning strike being predicted to obtain the lightning prediction result is implemented by the lightning prediction module. The lightning detection module and the lightning prediction module constitute a lightning early warning system that can send out early warning signals.

In this embodiment, the lightning detection module and the lightning prediction module use lightning sensors installed on the ground to measure the variation in electric field intensity in the air and the electromagnetic radiation generated by lightning activities and predict the position and the approximate time of the lightning strike by performing a time-domain quantitative analysis on the lightning activities on the basis of the broad-spectrum frequency-division sensing technology and in combination with the time-domain differential technology. This technology has been covered in the previously applied patent (application number CN201710615287.2) and thus is not detailed here.

In step 2, a transmission line possibly struck by lightning in a power grid are determined according to the lightning prediction result, and the transmission line possibly struck by the lightning and an adjacent line of the transmission line are taken as adjustment objects.

In this step, the geographic information provided by the geographic information system according to the lightning prediction result is compared with the topology of the power grid, and the transmission line that may trip out due to the lightning strike and the adjacent line associated with the transmission line are found. This step is implemented by the control and decision system.

In step 3, the control quantity of each adjustment object is calculated and distributed and sent to a corresponding UPFC facility according to the load condition of each adjustment object and the power flow control capability of the corresponding UPFC facility. This step is also implemented by the control and decision system.

In step 4, before the lightning occurs, an early warning signal and a control quantity sent out by the lightning prediction module are sent to the UPFC facility corresponding to the determined adjustment object. Each UPFC facility perform the power flow adjustment of the corresponding adjustment object according to the received control quantity, to transfer at least part of loads on the transmission line possibly struck by the lightning to the adjacent line.

Figure 6:
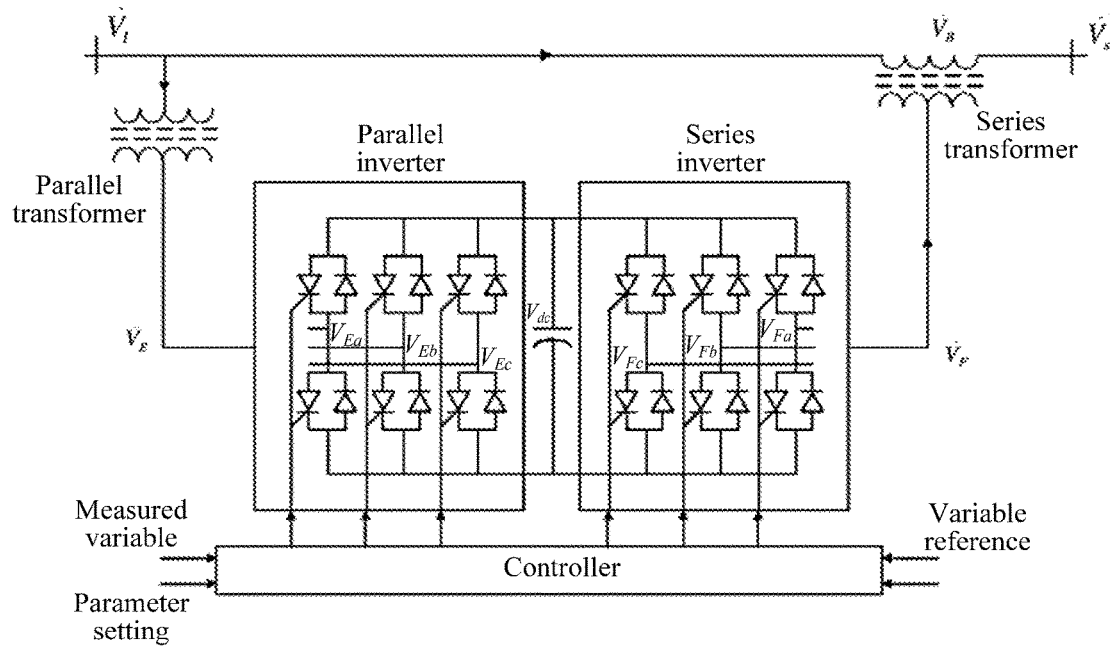
FIG. 6 is a schematic diagram of a unified power flow controller (UPFC) facility according to embodiment two of this application.

The principle of the UPFC facility is shown in FIG. 6, and the UPFC facility mainly includes two parts: a main circuit and a control unit. The control unit of the UPFC facility includes a controller connected to the control and decision system. The main circuit of the UPFC facility includes a parallel converter and a series converter that are controlled by the controller. The parallel converter and the series converter are in coupling connection through a common-side capacitor and are connected to the power grid through a parallel transformer and a series transformer respectively, so as to be connected to a controlled transmission line.

The series converter may inject a voltage with variable amplitude and phase into the grid system through the series transformer and the voltage can be superimposed, through in series, on a line where the UPFC is located, so as to achieve phase shift adjustment and series compensation of the line voltage. The power flow on a transmission line depends on the voltage amplitude and phase angle of a node, so the active and reactive power transmitted on the line can be flexibly controlled through adjusting the voltage of the UPFC access point. The main function of the parallel converter is to absorb active power from the power grid through the parallel transformer and then transmit the active power to the series converter through a direct-current connection line.

Figure 7:
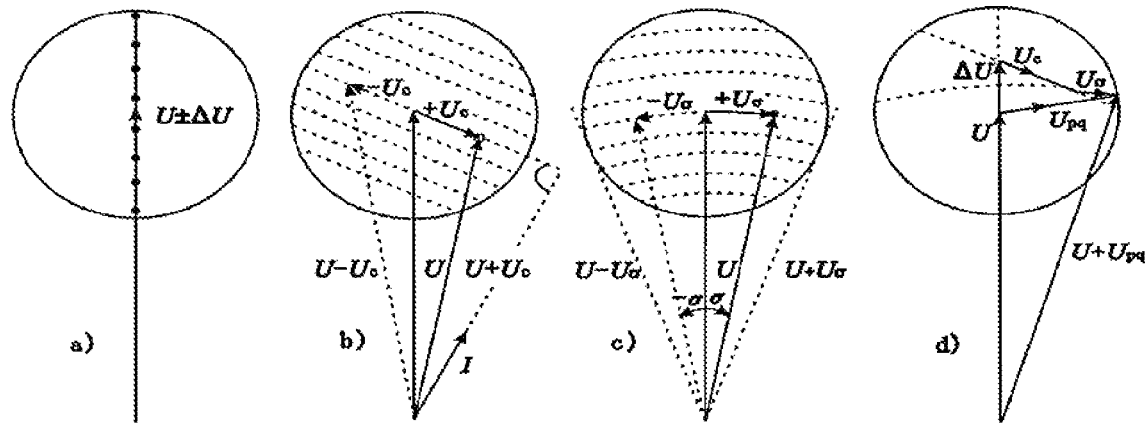
FIG. 7 is a schematic diagram illustrating four modes of a UPFC facility during operating according to embodiment two of this application.

FIG. 7 shows four modes during UPFC operating, namely modes of voltage adjustment, series compensation, phase angle adjustment and power flow control. In the voltage adjustment mode shown in (a) of FIG. 7, the output voltage of the series transformer has a phase same as or opposite to the line voltage, and the amplitude of the line voltage after the superimposition is the original amplitude plus or minus the output voltage of the series transformer, and the phase does not change; (b) of FIG. 7 shows the series compensation mode, and in this case, the phase of the compensation voltage and the phase of the line current differ by 90°; (c) of FIG. 7 shows the phase angle adjustment mode, and in this case, the UPFC is equivalent to a phase shifter, which only changes the phase angle of the line voltage but does not change the amplitude of the line voltage; (d) of FIG. 7 shows the power flow control mode, which is a combination of the preceding three modes.

Figure 8:
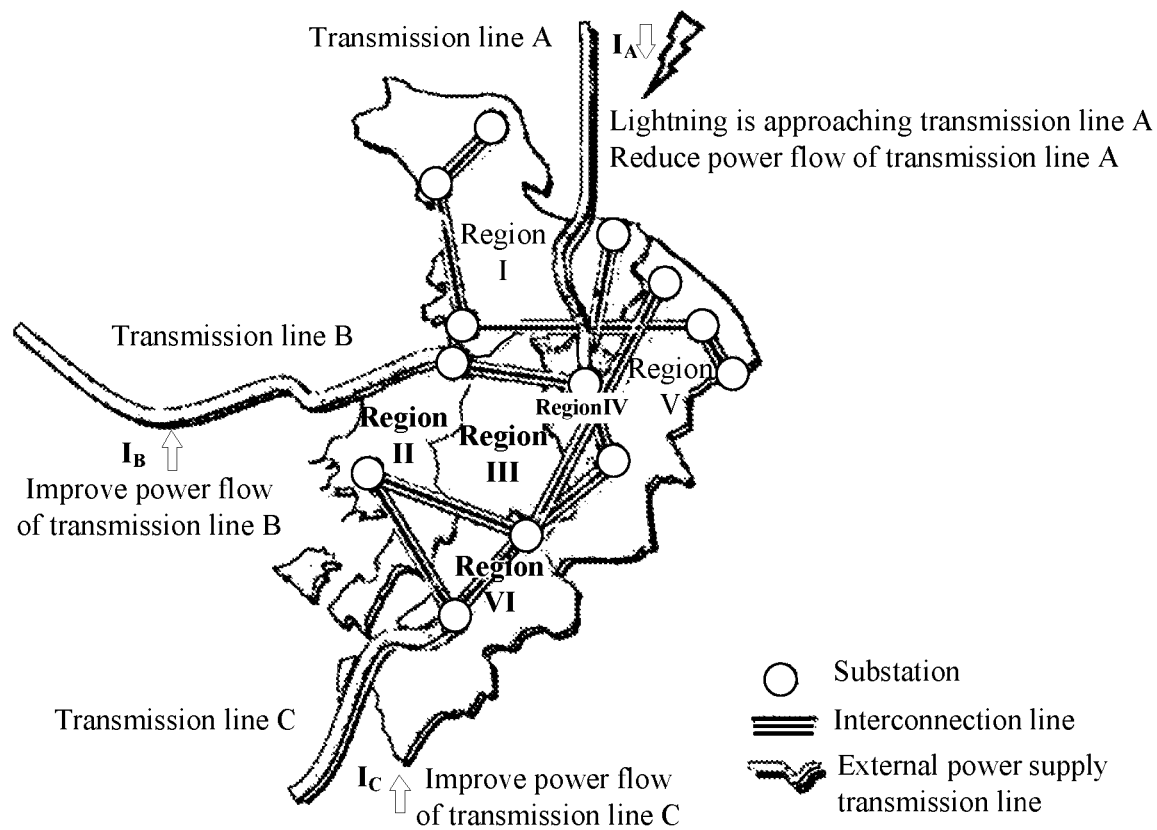
FIG. 8 is a schematic diagram of a power flow adjustment when a line is threatened by a lightning strike according to embodiment two of this application.

Apparently, during performing dynamic lightning protection, the UPFC should operate in the power flow control mode. Using a typical regional ring grid line as an example, as shown in FIG. 8, if it is inferred from the detection result of the lightning early warning system that the lightning will cause the trip-out of line A in a short time, the lightning early warning system simultaneously transmits an alarm signal to the controllers of the UPFCs on lines A, B and C, where the lines B and C are adjacent lines of the line A. Moreover, the control and decision system transmits a calculated control quantity to the UPFC on the line A, a calculated control quantity to the UPFC on the line B, and a calculated control quantity to the UPFC on the line C respectively. The UPFC on the line A controls its operation state through adjusting the converter, so as to enable the series transformer to output a voltage whose phase lags behind a phase of an original line voltage on the transmission line A possibly struck by the lightning, so that the amplitude of the line voltage after the superimposition is reduced and the phase of the line voltage after the superimposition lags behind, thereby reducing the power flow on the line A. At the same time, the UPFC on the line B and the UPFC on the line C each adjusts the series output voltage, and the UPFC on the line B outputs a voltage whose phase leads ahead a phase of an original line voltage on the adjacent line B and the UPFC on the line C outputs a voltage whose phase leads ahead a phase of an original line voltage on the adjacent line C, so that the amplitude of the voltage on the line after the superimposition increases and the phase leads ahead, thereby increasing the power flow passing through each of the two lines and thus achieving the transfer of loads on the line A to the lines B and C.

Since the control of a UPFC on a power flow is continuous and gradual, this transfer process has less impact on the power grid. In addition, the carrying capability and available margin of a line is considered when the UPFC controls the power flow so that loads are allocated more reasonably between lines and the overload of a single line is prevented. Therefore, the load transfer process by using a UPFC can ensure the stability of the power grid to a great extent.

After the load transfer is completed, even if the line A trips out due to the lightning strike, since most of the loads that line A carries has already been transferred, the impact of the trip-out on the power grid is greatly reduced, and the purpose of the lightning protection is thus achieved.

In step 5, after the lightning occurs and the threat of the lightning strike is removed, whether the transmission line A possibly struck by the lightning trips out is determined by using a telesignal of the switch. If the transmission line A possibly struck by the lightning does not trip out, a recovery signal is sent to the UPFC controller on each of the three lines, and the UPFC performs an opposite operation, so as to enable the loads recover to a state before the transferring. If the line A has tripped out, it is necessary to send a recovery signal to the UPFC on each line side after the completion of the accident handling, the completion of the line defect elimination work, and the reset of the telesignal of the switch.

Figure 9:
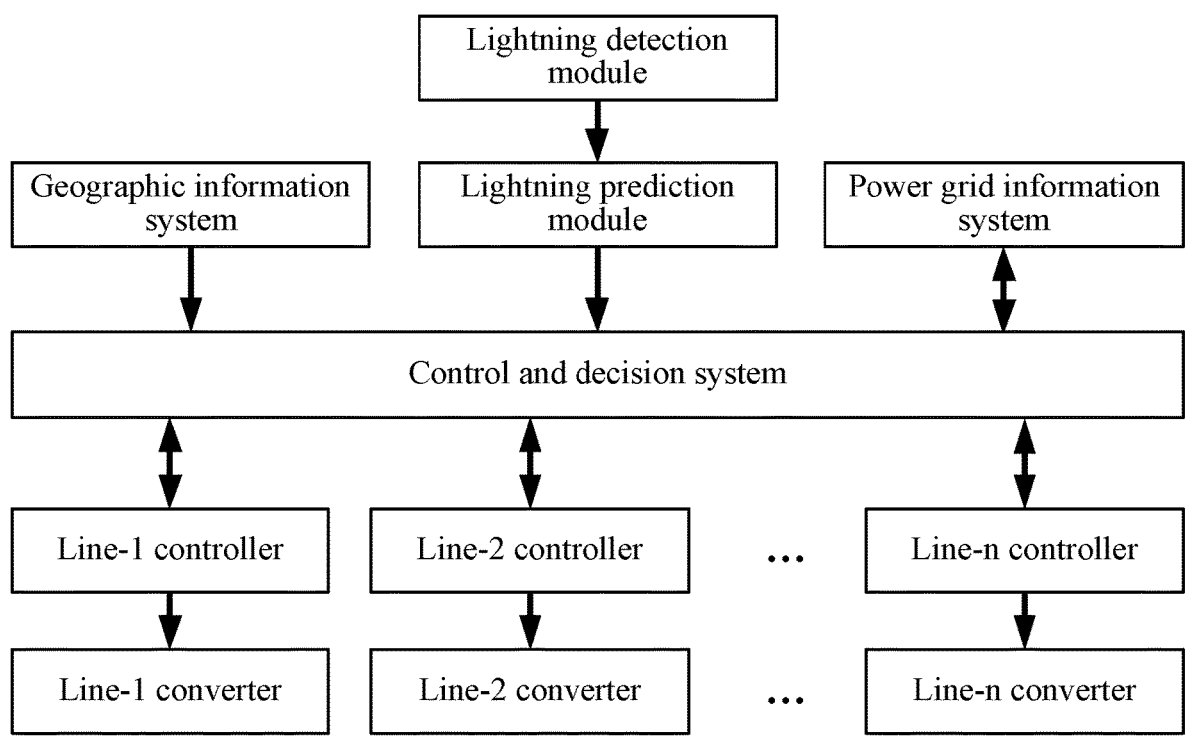
FIG. 9 is a schematic diagram of a load transfer system in thunder and lightning weather according to embodiment two of this application.

The preceding power-grid power flow adjustment method in thunder and lightning weather is implemented by a power-grid power flow adjustment system in thunder and lightning weather. As shown in FIG. 9, the power-grid power flow adjustment system in thunder and lightning weather mainly includes a lightning detection module, a lightning prediction module, a control and decision system, and a number of UPFC facilities configured in the power grid. The power-grid power flow adjustment system further includes a geographic information system and a power grid information system.

The lightning detection module is configured to detect lightning. The lightning prediction module is connected to the lightning detection module and configured to predict a position and time of a lightning strike to obtain a lightning prediction result. The two modules form a lightning detection system, which can be implemented based on the related art. In the lightning detection module, a lightning sensor detects the electromagnetic radiation generated during the forming of the lightning and the variation in the electric field in the air during the forming of the lightning and transmits the waveform data to the lightning prediction module. The lightning prediction module predicts the lightning situation in the region within a period of time based on the current waveform and sends the prediction result to the control and decision system.

The control and decision system is connected to a lightning prediction module and configured to determine a transmission line possibly struck by lightning and an adjacent line of the transmission line in the power grid and take the transmission line possibly struck by the lightning and the adjacent line as adjustment objects, calculate and allocate the control quantity of each adjustment object according to the load condition of each adjustment object and the power flow control capability of a corresponding UPFC facility and send the control quantity to the corresponding UPFC facility. The control and decision system selects a line that requires load adjustment according to the lightning strike prediction result and in combination with regional geographic information, the topology of the power grid and real-time load conditions of equipment, and then sends the adjustment amount to the controller of the UPFC corresponding to the line.

Each UPFC facility is connected to the control and decision system separately and connected to a corresponding transmission line. Each UPFC facility is configured to perform the power flow adjustment of the corresponding adjustment object according to the received control quantity, to transfer at least part of loads on the transmission line possibly struck by the lightning to the adjacent line. After the controller of the UPFC facility performs the power flow adjustment, the controller of the UPFC facility returns the adjustment result to the control and decision system, and the control and decision system updates power grid information according to the feedback.

Therefore, the geographic information system connected to the control and decision system is configured to provide the control and decision system with the geographic information required in determining the transmission line possibly struck by the lightning and the adjacent line. The power grid information system connected to the control and decision system is configured to provide the control and decision system with power grid information and update power grid information under the control of the control and decision system.

According to the load transfer method in thunder and lightning weather provided in this embodiment of this application, effective and active adjustment can be accurately and quickly performed on the power flow of the power grid before the lightning occurs, thereby improving the stability of the power grid and reducing the load losses of the power grid caused by the lightning. Moreover, the implementation cost is low.

This scheme proposes a power flow control strategy for a power grid in lightning storm weather, that is, "active protection and active control", and designs a corresponding collaborative system that organically combines dynamic lightning protection with UPFC. The scheme has the advantages described below.

(1) High accuracy rate of lightning strike prediction: the position and the approximate time of the lightning strike within a range of hundreds of kilometers can be accurately predicted through measuring electromagnetic radiation and electric field intensity in the atmosphere by the sensors, so that precautionary measures can be taken for the equipment in the lightning region. In terms of the operation of the technology, the accuracy rate of lightning strike prediction has reached more than 99% in the core detection region covering 200 square kilometers, and the prediction error of the position of the lightning strike is between 100-250 m. This is enough to satisfy the accuracy requirements in prediction of a fault caused by the trip-out of a lightning-struck line.

(2) Fast response speed and sufficient response time: since a lightning strike can be predicted a long time ago, the UPFC facility has enough response time to control the power flow and thus can maximize the control capability of the UPFC. Moreover, the lightning strike prediction result is linked to UPFCs so that loads on a faulty line can be transferred automatically, and the response speed is greatly increased.

(3) High stability of the power grid: before a lightning strike fault occurs, the UPFC can reasonably allocate the power flow according to the architecture and real-time operation of the power grid to achieve the precise adjustment and control of the power flow of the power grid, thereby avoiding excessive power flow of a single circuit. Moreover, since the power flow of the line is transferred in advance, the power flow changes little at the moment of tripping out caused by the lightning strike, so the impact on the power grid is also small, thereby improving the stability of the power grid when a lightning strike accident occurs. This enables the lightning accident to be restricted within a small range without threatening the stability of the power grid.

(4) Small load loss: benefiting from accurate lightning strike prediction and fast power flow control, loads on the line adjacent to a lightning strike point can be quickly and accurately transferred to other lines before the lightning strike occurs, so even if the line trips out, the load losses caused can be greatly reduced.

(5) Low use cost: since currently a power grid is usually equipped with UPFC facilities, the equipment required to be added in this method includes only a lightning detection sensor and a related control and decision system. Since the lightning detection core region covers about 200 square kilometers, the required hardware cost is low and does not change significantly with the increase in the number of power grid equipment.

What is claimed is:

1. A load transfer method in thunder and lightning weather, comprising:
    detecting lightning and predicting a position and time of a lightning strike to obtain a lightning prediction result;
    determining a transmission line possibly struck by lightning in a power grid according to the lightning prediction result;
    determining a load transfer scheme; and
    before the lightning occurs, transferring at least part of loads on the transmission line possibly struck by the lightning according to the load transfer scheme;
    wherein determining the load transfer scheme comprises:
        determining the load transfer scheme according to a classification result obtained by pre-classifying a plurality of loads in the power grid; and
    wherein transferring the at least part of the loads on the transmission line possibly struck by the lightning comprises:
        transferring the at least part of the loads on the transmission line possibly struck by the lightning to at least one of the following: a standby transmission line, a distributed micro-grid or a power storage device.

2. The method of claim 1, after transferring the at least part of the loads on the transmission line possibly struck by the lightning to the standby transmission line, further comprising:
    in response to the lightning, transferring the remaining part of the loads on the transmission line to at least one of the following: the distributed micro-grid or the power storage device.

3. The method of claim 2, further comprising:
    after the lightning occurs, recovering the transferred loads to a state before the transferring in a case where the transmission line possibly struck by the lightning operates normally.

4. The method of claim 1, wherein pre-classifying the plurality of loads in the power grid comprises:
    classifying the plurality of loads in the power grid into primary loads, important loads and general loads according to significance; and
    classifying customers in the power grid into a sort-I customer, a sort-II customer, a sort-III customer and a sort-IV customer according to loads owned by the customers in the power grid, wherein the sort-I customer is a customer who owns both primary loads and important loads, the sort-II customer is a customer who owns primary loads but does not own important loads, the sort-III customer is a customer who owns important loads but does not own primary loads, and the sort-IV customer is a customer who owns only general loads.

5. The method of claim 4, wherein determining the load transfer scheme according to the classification result comprises:
    transferring the primary loads owned by the sort-I customer and the primary loads owned by the sort-II customer to the standby transmission line, transferring at least one of important loads owned by the sort-I customer or general loads owned by the sort-II customer to at least one of the distributed micro-grid or the power storage device, and keeping loads owned by the sort-III customer and loads owned by the sort-IV customer unchanged.

6. The method of claim 5, wherein during determining the load transfer scheme, a part of primary loads owned by the sort-I customer and the sort-II customer is transferred to at least one of the distributed micro-grid or the power storage device in a case where remaining capacity of the standby transmission line is not enough to carry the primary loads owned by the sort-I customer and the sort-II customer.

7. The method of claim 1, wherein determining the transmission line possibly struck by the lightning in the power grid according to the lightning prediction result further comprises:
    determining an adjacent line of the transmission line possibly struck by the lightning in the power grid according to the lightning prediction result; and
    wherein transferring the at least part of the loads on the transmission line possibly struck by the lightning comprises:

transferring the at least part of the loads on the transmission line possibly struck by the lightning to the adjacent line.

8. The method of claim 7, wherein determining the load transfer scheme comprises:
taking the transmission line possibly struck by the lightning in the power grid and the adjacent line as adjustment objects, calculating and allocating a control quantity of each adjustment object according to a load condition on each adjustment object and a power flow control capability of a unified power flow controller (UPFC) facility corresponding to each adjustment object, and sending the control quantity of each adjustment object to the UPFC facility corresponding to a respective adjustment object; and
wherein before the lightning occurs, transferring the at least part of the loads on the transmission line possibly struck by the lightning according to the load transfer scheme comprises:
before the lightning occurs, performing, by the UPFC facility corresponding to the respective adjustment object, power flow adjustment of the respective adjustment object according to the received control quantity, to transfer the at least part of the loads on the transmission line possibly struck by the lightning to the adjacent line.

9. The method of claim 8, wherein during load transfer, a UPFC facility for controlling the transmission line possibly struck by the lightning outputs, according to the control quantity of the transmission line possibly struck by the lightning, a voltage whose phase lags behind a phase of an original line voltage of the transmission line possibly struck by the lightning, and a UPFC facility for controlling the adjacent line outputs, according to the control quantity of the adjacent line, a voltage whose phase leads ahead a phase of an original line voltage of the adjacent line.

10. The method of claim 1, further comprising:
after the lightning occurs, determining whether the transmission line possibly struck by the lightning trips out, and recovering the transferred loads to a state before the transferring in a case where the transmission line possibly struck by the lightning does not trip out.

11. A load transfer system in thunder and lightning weather, comprising:
a lightning detection module, which is configured to detect lightning;
a lightning prediction module, which is connected to the lightning detection module and configured to predict a position and time of a lightning strike to obtain a lightning prediction result;
a control and decision system, which is connected to the lightning prediction module and configured to determine a transmission line possibly struck by lightning in a power grid according to the lightning prediction result and determine a load transfer scheme; and
an executive system, which is connected to the control and decision system and configured to before the lightning occurs, execute the load transfer scheme to transfer at least part of loads on the transmission line possibly struck by the lightning;
wherein the control and decision system is configured to determine the load transfer scheme in the following way:
determining the load transfer scheme according to a classification result obtained by pre-classifying a plurality of loads in the power grid; and
wherein the control and decision system is further configured to send out a control signal corresponding to the load transfer scheme, and the executive system comprises an executive module, wherein the executive module is connected to the control and decision system and the power grid and the executive module is configured to execute the load transfer scheme according to the control signal, to transfer the at least part of the loads on the transmission line possibly struck by the lightning to at least one of the following: a standby transmission line, a distributed micro-grid or a power storage device.

12. The system of claim 11, further comprising:
a geographic information system, which is connected to the control and decision system and configured to provide the control and decision system with geographic information required in determining the transmission line possibly struck by the lightning in the power grid.

13. The system of claim 11, further comprising:
a main-grid monitoring system, which is connected to the control and decision system and configured to provide the control and decision system with operation status data of the power grid; and
a micro-grid monitoring system, which is connected to the control and decision system and configured to provide the control and decision system with operation status data of the distributed micro-grid.

14. The system of claim 11, wherein the control and decision system is further configured to determine an adjacent line of the transmission line possibly struck by the lightning in the power grid according to the lighting prediction result; and wherein the executive system is further configured to transfer the at least part of the loads on the transmission line possibly struck by the lightning to the adjacent line.

15. The system of claim 14, wherein
the executive system further comprises a plurality of unified power flow controller (UPFC) facilities, each of the plurality of UPFC facilities is connected to the control and decision system and is connected to a respective transmission line;
the control and decision system is further configured to, take the transmission line possibly struck by the lightning in the power grid and the adjacent line as adjustment objects, calculate and allocate a control quantity of each adjustment object according to a load condition on each adjustment object and a power flow control capability of a UPFC facility corresponding to each adjustment object, and send the control quantity of each adjustment object to the UPFC facility corresponding to a respective adjustment object; and
the UPFC facility corresponding to the respective adjustment object is configured to perform power flow adjustment of the respective adjustment object according to the received control quantity, to transfer the at least part of the loads on the transmission line possibly struck by the lightning to the adjacent line.

16. The system of claim 14, further comprising:
a geographic information system, which is connected to the control and decision system and configured to provide the control and decision system with geographic information required in determining the transmission line possibly struck by the lightning in the power grid and the adjacent line.

17. The system of claim 14, further comprising:
a power grid information system, which is connected to the control and decision system and configured to provide the control and decision system with power grid information and update power grid information under control of the control and decision system.

* * * * *